(12) United States Patent
Fukata et al.

(10) Patent No.: US 6,452,241 B1
(45) Date of Patent: Sep. 17, 2002

(54) THIN FILM TRANSISTOR FOR USE IN LIQUID CRYSTAL DISPLAY DEVICE AND METHOD FOR MANUFACTURING THE SAME

(75) Inventors: Tamaki Fukata; Kenji Sera; Isao Sasaki, all of Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/686,668

(22) Filed: Oct. 11, 2000

(30) Foreign Application Priority Data

Oct. 15, 1999 (JP) .............................. 11-294081

(51) Int. Cl.[7] .................. H01L 29/04; H01L 31/20; H01L 31/036; H01L 31/0376
(52) U.S. Cl. ...................... 257/435; 257/59; 257/72; 257/350; 438/155
(58) Field of Search ..................... 257/59, 72, 350, 257/435; 438/151, 155

(56) References Cited

U.S. PATENT DOCUMENTS 5,914,498 A * 6/1999 Suzawa et al. ............... 257/66
6,259,120 B1 * 7/2001 Zhang et al. .................. 257/72

* cited by examiner

Primary Examiner—Ngân V. Ngô
(74) Attorney, Agent, or Firm—Hutchins, Wheeler & Dittmar

(57) ABSTRACT

A pair of lightly doped drain (LDD) regions are provided in a thin film transistor of each pixel of a thin film transistor substrate for a liquid crystal display device and a light shielding portion of a material having reflectivity lower than that of a metal and covering a portion or a whole portion of the LDD regions is provided so as to restrict an internal random reflection of light.

19 Claims, 8 Drawing Sheets

THIN FILM TRANSISTOR FOR USE IN LIQUID CRYSTAL DISPLAY DEVICE AND METHOD FOR MANUFACTURING THE SAME

BACKGROUND OF THE INVENTION

1. Field of the Invention

The present invention relates to a thin film transistor for use in a liquid crystal display device and a method for fabricating the transistor and, particularly, to a thin film transistor having an LDD (Lightly Doped Drain) structure and a manufacturing method therefor.

2. Description of the Prior Art

As a display for a wall type TV, a projection type TV or an OA (Office Automation) device, the development of a display device using a liquid crystal panel has been performed recently. Among liquid crystal panels, an active matrix liquid crystal display constructed by incorporating thin film transistors, which are active elements, in a liquid crystal display device is specifically expected as useful in a display device for high class OA device or for high definition TV in view of the merit thereof that contrast and response speed are not reduced even if the number of scan lines is increased. According to the active matrix type liquid crystal panel, a large size display can be easily realized in the projection type display such as liquid crystal projection.

It is usual in an active matrix type liquid crystal display device using a light bulb for a liquid crystal projection in which lights passing through pixels are controlled correspondingly to a pixel information by irradiating small elements with intense lights and performing ON/OFF operation of each pixel by switching liquid crystal by means of thin film transistors (TFT's) and the passed light is enlarged and projected onto a screen, etc., through an optical element such as a lens system. In such case, when an active layer of the TFT is formed of polysilicon, a leakage current thereof in OFF time becomes a problem due to optical excitation in a channel portion of the TFT by influence of not only the incident light but also reflection light from the optical system.

Such active matrix type liquid crystal display device using a light bulb usually includes a first light shield film provided on a TFT substrate and a second light shielding film provided on the TFT on the side of an opposing substrate or the TFT substrate. That is, when light is incident on the TFT from the side of the opposing substrate through a liquid crystal layer, the incident light is shielded by the second light shield film and reflection light from an underlying glass substrate or the optical system is shielded by the first light shield film.

The light shield films are formed on the respective substrates by laminating them on the TFT's, a wiring layer and interlayer films and the light shield films are preferably about 0.01 to 0.1 μm thick, respectively, since, if the film thickness is too large, breakage or short-circuit of the wiring may occur, and is preferably formed of a material having light shielding characteristics which is enough against intense light of in the order of several millions in lx.

Metal or metal silicide, which is stable in a heating step of a fabrication process of the liquid crystal panel, is usually used as the material of the light shielding film. However, the reflectivity of metal or metal silicide is high and, when the TFT's are sandwiched between the light shielding films, random reflection occurs within the TFT substrate due to reflection by surfaces of the layers. Therefore, a new problem that a portion of reflected light reaches the TFT's, causing leakage of light to occur. Intensity of such reflected light is not negligible under condition of intense illumination light from the light bulb and, in order to reduce optical leak current, a countermeasure to reflected light must be taken.

The TFT having the LDD structure is usually formed by using a gate electrode thereof as a mask. FIG. 1 is a plan view of a TFT having a conventional LDD structure, FIG. 2 is a partial cross section taken along a line A—A in FIG. 1 and FIG. 3 is a partial cross section taken along a line B—B in FIG. 1.

As shown in FIG.'s. 1 to 3, showing the conventional TFT for liquid crystal display, the first light shielding film 42 is formed on a transparent insulating substrate 41 of such as glass or quartz. On the first light shielding film 42, a boron-doped polysilicon layer 44, which becomes an active layer of the TFT, is formed through the first interlayer film 43 and a gate oxide film 50 is formed on the boron-doped polysilicon layer 44. The lamination is patterned suitably. A patterned resist is formed in regions of a channel region 45 and an LDD 46 on the gate oxide film 50 and a source region 47 and a drain region 48 are formed by ion-injection through the resist as a mask. After the resist is removed, a gate electrode 51 is formed and the channel region 45 and the LDD regions 46 are formed between the source region and the drain region by injecting ions again through the gate electrode as a mask. On the channel region 45 and the LDD regions 46, a data line 54 is formed through the second interlayer film 53. Furthermore, the second light shielding film 56 is formed through the third interlayer film 55. On the second light shielding film 56, the fourth interlayer film 57 is formed and a liquid crystal panel is completed by forming pixel electrodes 62, a liquid crystal layer 60 and an opposing substrate 61 thereon in the order. In FIG. 1, only one pixel electrode 62 is shown at the central picture cell and other corresponding pixel electrodes for other picture cells are not shown to avoid confusion of the drawing.

In this case, light incident on the side of the liquid crystal layer is blocked by the second light shielding film 56 and reflection light from the substrates and the optical system is blocked by the first light shielding film 42. However, a portion of rear surface reflection light is further reflected by a rear surface of the second light shielding film 56. A resultant secondary reflection light irradiates the LDD regions 46 which is not covered by the gate wiring, causing optical leakage current by which the display quality is degraded.

SUMMARY OF THE INVENTION

An object of the present invention is to provide a novel thin film transistor for a liquid crystal display device capable of reducing optical leakage current by covering LDD regions of the thin film transistor by a gate electrode thereof and a manufacturing method of the same thin film transistor.

In order to achieve the above object, the present invention basically employs a technical construction to be described.

According to the first aspect of the present invention, a thin film transistor for a liquid crystal display device formed on a transparent substrate, which comprises a gate electrode, a source region and a drain region formed on both sides of a channel region immediately below the gate electrodes, respectively, and LDD regions formed between the source region and the channel region and between the channel region and the drain region, respectively, is featured by that light shielding portions covering all of the LDD regions are provided on the gate electrodes, respectively.

According to the second aspect of the present invention, the thin film transistor of the liquid crystal display device having the above mentioned construction is featured by a provision of a light shielding portion partially covering the LDD region.

According to the third aspect of the present invention, the width of the light shielding portion is larger than a channel width of the thin film transistor.

According to the fourth aspect of the present invention, a cross sectional configuration of the light shielding portion has a taper such that the thickness of a front portion of the light shielding portion is reduced gradually.

A manufacturing method of the thin film transistors for the liquid crystal display device formed on a transparent substrate, which comprises a gate electrode, a source region and a drain region formed on both sides of a channel region immediately below the gate electrode, respectively, and LDD regions formed between the channel region and the source region and between the channel region and the drain region, respectively, according to the present invention, is featured by comprising at least the first step of forming the first light shielding film on the transparent substrate and forming the first interlayer film on the first light shielding film, the second step of forming the first polysilicon layer on the first interlayer film, patterning it to a predetermined configuration and forming a gate oxide film on the first polysilicon layer, the third step of covering portions of the first polysilicon layer, which becomes the channel region and the LDD regions, respectively, and injecting ions into regions which become the source region and the drain region, the fourth step of covering only the channel region and forming the drain region, the drain region and the LDD regions by further injecting ions into portions which become the source region, the drain region and the LDD regions, the fifth step of forming the second polysilicon layer, patterning it such that it covers the channel region and the LDD regions, forming the gate electrode and forming a gate line on the gate electrode and the sixth step of forming the second interlayer film on the gate line, forming a data line on the second interlayer film and forming the second light shielding film on the data line through the third interlayer film.

According to the second aspect of a manufacturing method of the thin film transistors, according to the present invention, the method is featured by comprising at least the first step of forming the first light shielding film on the transparent substrate and forming the first interlayer film on the first light shielding film, the second step of forming the first polysilicon layer on the first interlayer film, patterning it to a predetermined configuration and forming a gate oxide film on the first polysilicon layer, the third step of depositing the second polysilicon layer on the gate oxide film and forming gate electrode by patterning it to cover a channel region and LDD regions, the fourth step of forming a metal wiring layer, which becomes a gate line, on the gate electrode, the fifth step of simultaneously forming a source region, a drain region and the LDD regions by injecting ions by using the gate electrode and the metal wiring layer as a mask such that low concentration ions are injected to the LDD regions covered by the gate electrode and high concentration ions are injected to the region, which is not covered by the gate electrode, and the sixth step of forming the second interlayer film on the gate line, forming a data line on the second interlayer film and forming the second light shielding film on the data line through the third interlayer film.

According to the third aspect of a manufacturing method of the thin film transistors, according to the present invention, the method is featured by comprising at least the first step of forming the first light shielding film on the transparent substrate and forming the first interlayer film on the first light shielding film, the second step of forming a first polysilicon layer on the first interlayer film, patterning it to a predetermined configuration and forming a gate oxide film on the first polysilicon layer, the third step of depositing the second polysilicon layer on the gate oxide film, forming a gate electrode by patterning it to cover a channel region and LDD regions and, simultaneously therewith, tapering thickness of the gate electrode such that the thickness of a top end portion thereof is reduced gradually, the fourth step of simultaneously forming a source region, a drain region and the LDD regions by injecting ions with using the gate electrode as a mask, the fifth step of forming a metal wiring layer, which becomes a gate line, on the gate electrode and the sixth step of forming a second interlayer film on the gate line, forming a data line on the second interlayer film and forming the second light shielding film on the data line through the third interlayer film.

BRIEF DESCRIPTION OF THE DRAWINGS

This above-mentioned and other objects, features and advantages of the present invention will become more apparent by reference to the following detailed description of the invention taken in conjunction with the accompanying drawings, in which.

DETAILED DESCRIPTION OF THE PREFERRED EMBODIMENTS

The first embodiment of a thin film transistor for use in a liquid crystal display device and a manufacturing method thereof, according to the present invention will be described with reference to FIG. 4 to FIG. 7.

Figure 1:
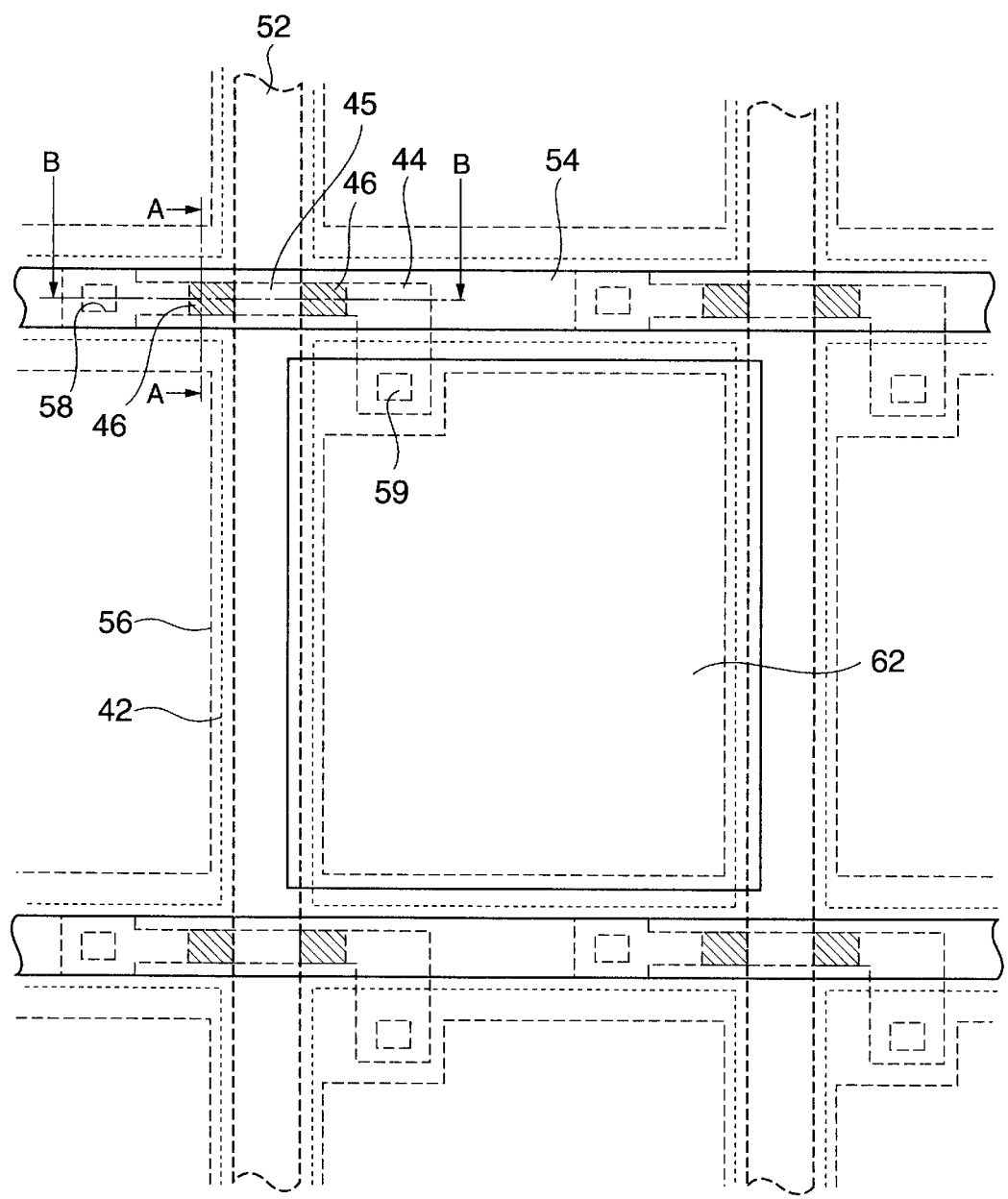
FIG. 1 is a plan view of a pixel of a conventional thin film transistor.
Figure 2:
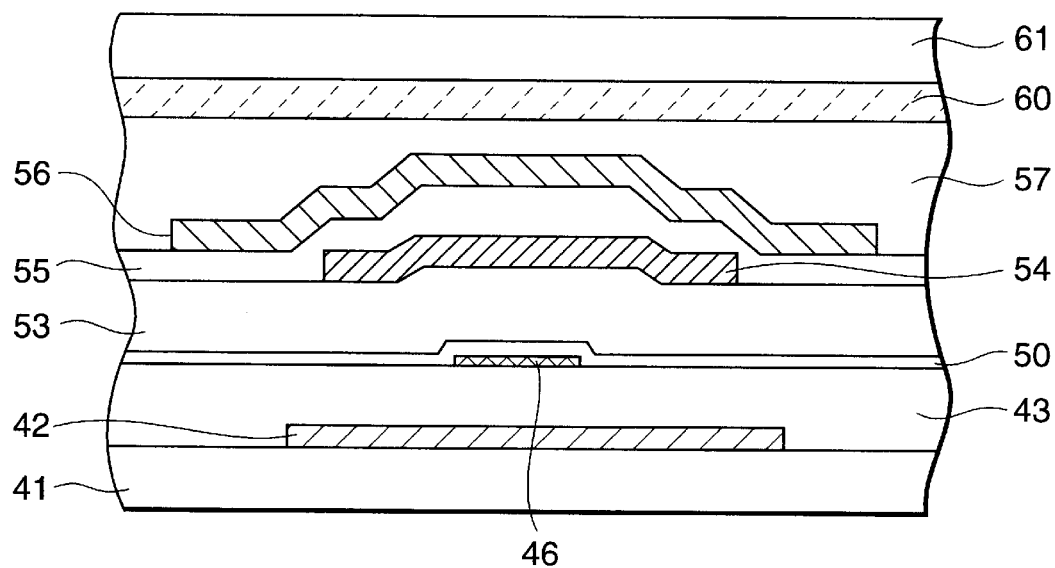
FIG. 2 is a cross section taken along a line A—A in FIG. 1.
Figure 3:
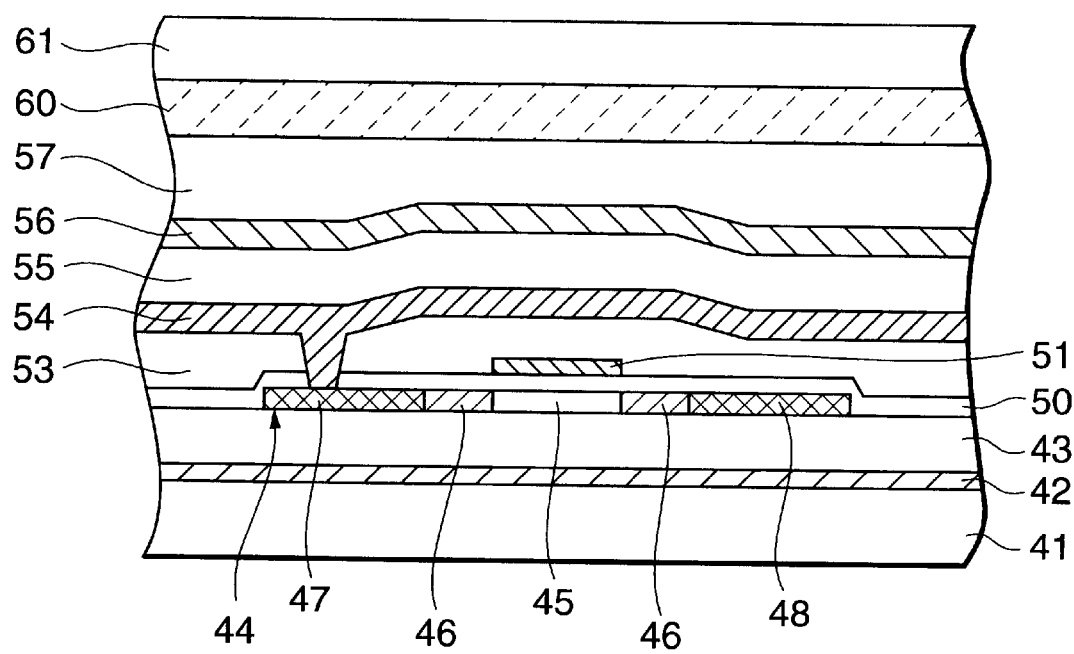
FIG. 3 is a cross section taken along a line B—B in FIG. 1.
Figure 4:
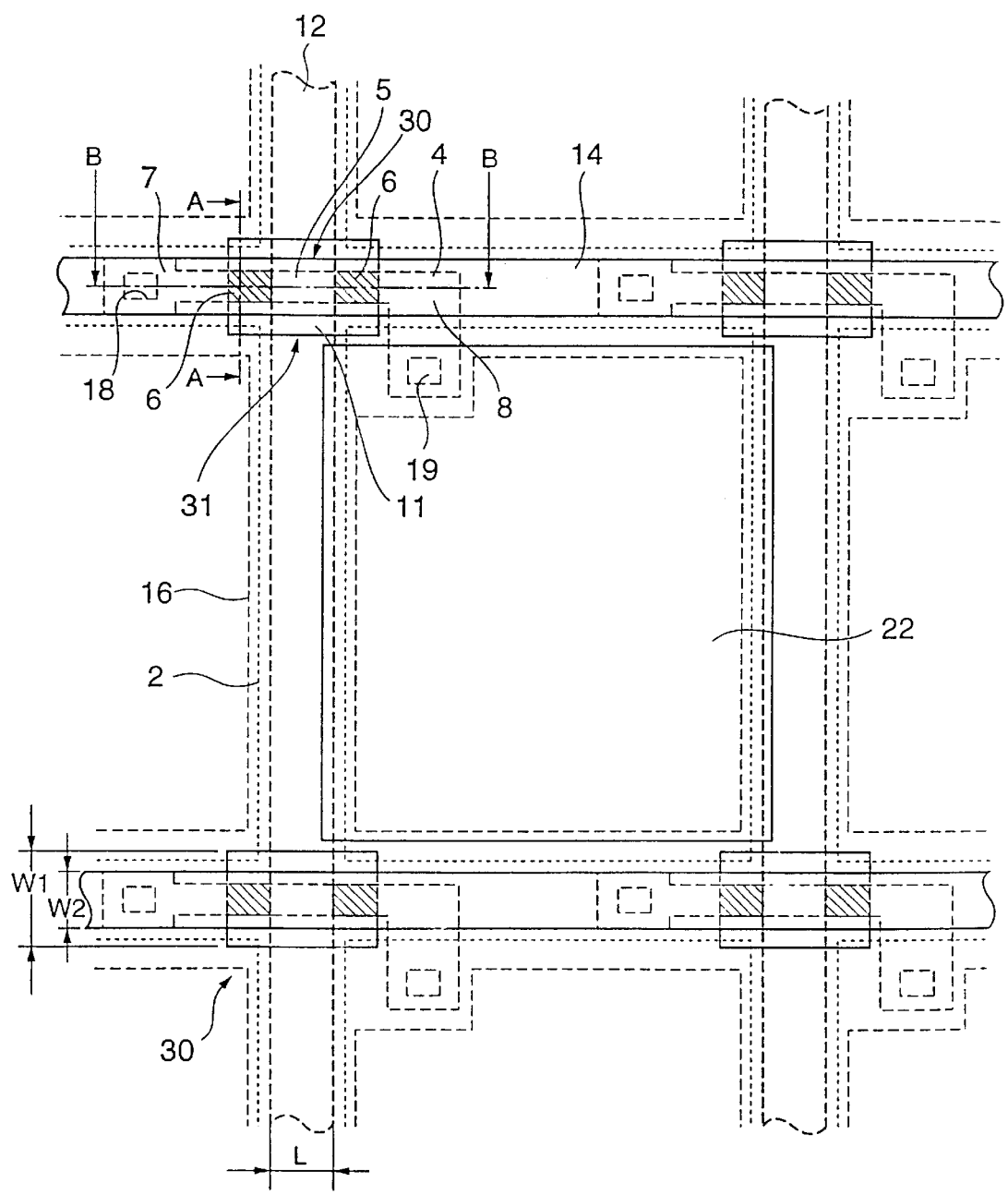
FIG. 4 is a plan view of a pixel of a thin film transistor of a liquid crystal display device according to the present invention.
Figure 5:
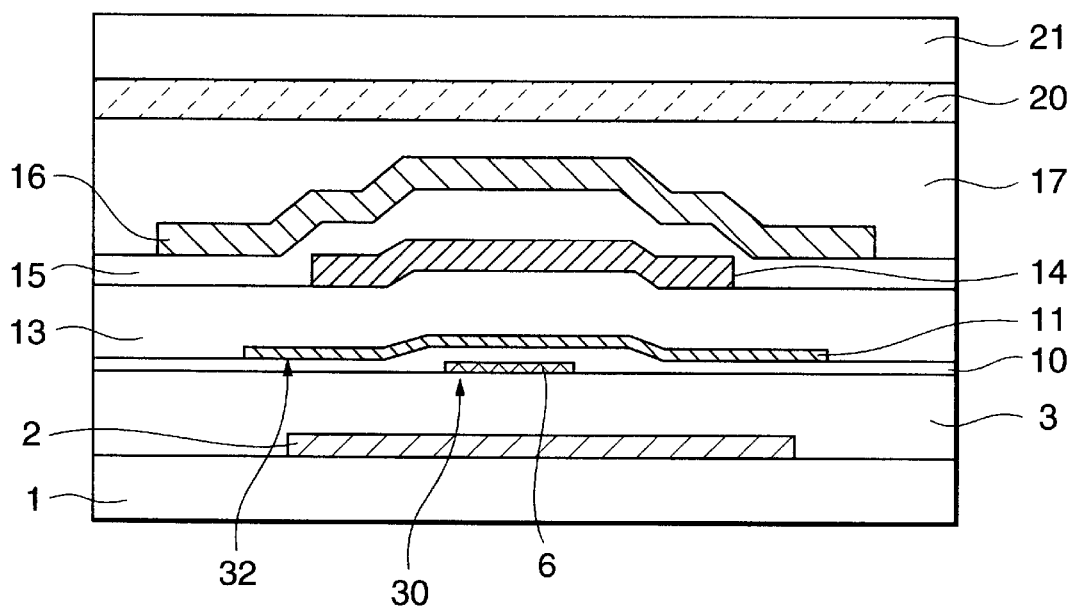
FIG. 5 is a cross section taken along a line A—A in FIG. 4.

In FIG. 4, which is a plan view of one of pixels of an active matrix type liquid crystal display device, the pixels are formed in respective regions sectioned in matrix. A thin film transistor (referred to as "TFT", hereinafter) is formed below the second light shielding film 16 in a vicinity of each of cross points of gate lines 12 and data lines 14 and functions to ON/OFF switch a corresponding pixel electrode 22. In FIG. 4 as well as in FIG. 1, only one pixel electrode 22 is shown at the central picture cell and other corresponding pixel electrodes for other picture cells are not shown to avoid confusion of the drawing. As shown in FIG. 4 and FIG. 5 which is a cross section taken along a line A—A in FIG. 4, a TFT substrate 100 is constructed with a transparent insulating substrate 1 of such as a glass material and the TFT 30 which functions as a switching element of each pixel and is formed on the transparent insulating substrate 1. The liquid crystal display device is constructed with the TFT substrate 100, an opposing substrate 21 on which an opposing electrode is formed and a liquid crystal layer 20 provided between the TFT substrate 100 and the opposing substrate 21. Although, in this embodiment, the second light shielding film 16 is formed on the side of the TFT substrate 100, it may be formed on the side of the opposing substrate 21, alternatively.

Respective layers formed on the TFT substrate will be described in detail with reference to FIG. 4 to FIG. 6.

Figure 6:
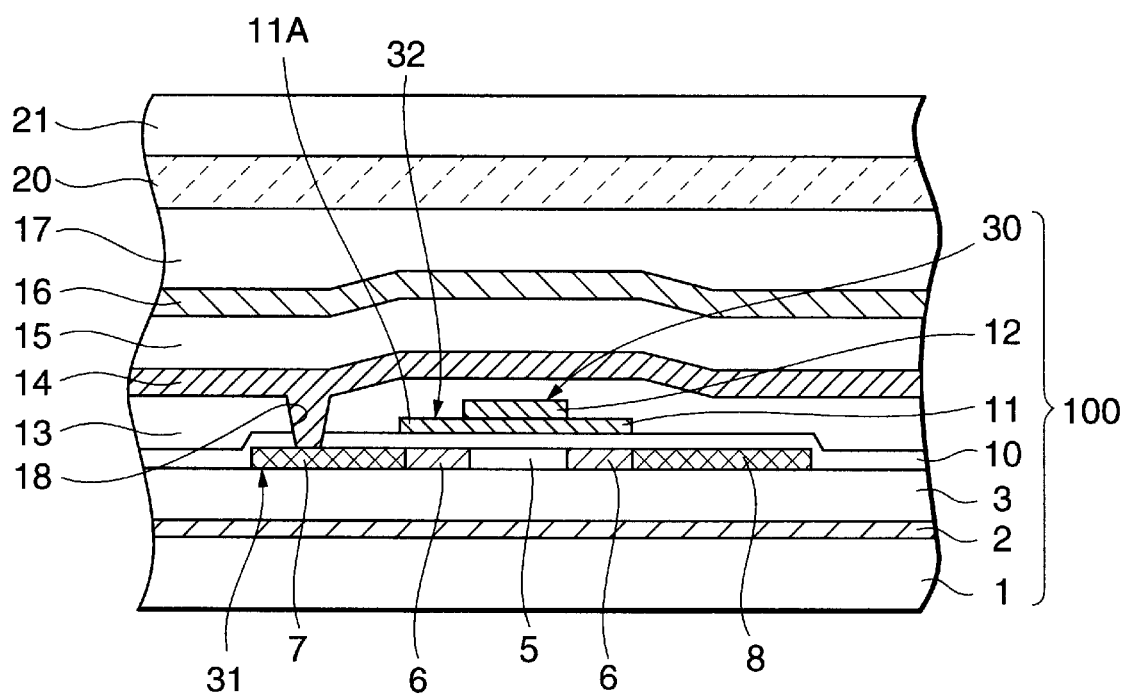
FIG. 6 is a cross section taken along a line B—B in FIG. 4.

As shown in FIG. 6 which is a cross section taken along a line B—B in FIG. 4, the TFT is constructed with the first polysilicon layer 31 including a source region 7 and a drain region 8, the second polysilicon layer 32 including a gate electrode 11 and a gate oxide film 10 between the first and second polysilicon layers. The first light shielding film 2 for blocking light incident on the TFT 30 from the side of the TFT substrate is provided between the TFT 30 and the transparent insulating substrate 1. The first interlayer insulating film 3 of $SiO_2$ is provided between the first light shielding film 2 and the TFT 30. The second interlayer insulating film 13 of SiN is provided to cover the second polysilicon layer 32 which forms the gate electrode 11, the gate oxide film 10 and a metal wiring layer 12 which forms a scan signal line (gate line). The third interlayer insulating film 15 of SiN is formed on the second interlayer insulating film 13 through a data line 14 of aluminum. A plurality of the data lines 14 are provided in a direction orthogonal to the gate line 12 and are connected to the sources 7 through contact holes 18 formed in the second interlayer insulating film 13 and the gate oxide film 10.

Furthermore, on the third interlayer insulating film 15, the second light shielding film 16 of aluminum is provided to cover the TFT region 4 and the wiring portion. In addition, the fourth interlayer insulating film 17 for flattening is provided to cover the third interlayer insulating film 15 and the second light shielding film 16. Contact holes 19 are formed in the fourth interlayer insulating film 17, the second light shielding film 16, the third interlayer insulating film 15, the second interlayer insulating film 13 and the gate oxide film 10. An indium-tin-oxide (ITO) film which is patterned to the respective pixels is formed on the fourth interlayer insulating film 17. The patterned ITO film is connected to the drain region 8 through the contact holes 19 to function as a pixel electrode.

Now, forming methods of the respective layers will be described.

First, the first light shielding film 2 is formed on the insulating substrate 1 of such as glass. The first light shielding film 2 is formed of tungsten silicide. Alternatively, it may be possible to use chromium, etc., for the first light shielding film 2. Tungsten silicide has stable properties against a later heat treatment step of the TFT and, when the thickness thereof is about 0.1 $\mu$m, its light shielding performance becomes enough. In this embodiment, the thickness of the first light shielding film 2 was 0.175 $\mu$m. The first light shielding film 2 is formed by sputtering or CVD.

Then, the first interlayer insulating film 3 is formed to cover the first light shielding film 2. In this embodiment, the first interlayer insulating film 3 was a $SiO_2$ film formed by CVD. The first interlayer insulating film 3 has to be thick enough to exclude degradation of the electrical characteristics of the TFT due to diffusion of impurities such as metals from the glass substrate 1 underlying the first interlayer insulating film 3 during later manufacturing steps of the TFT. In view of this, the thickness of the first interlayer insulating film 3 may be, for example, 1 $\mu$m.

The TFT is formed on the first interlayer insulating film 3. First, a boron doped amorphous silicon layer 0.075 $\mu$m thick is formed on the first interlayer insulating film 3 by CVD. Then, the amorphous silicon layer is laser-annealed and the first polysilicon layer 31 is formed from the annealed amorphous silicon layer through a photolithography step and an etching step. Then, the gate oxide film 10 having thickness of 0.1 $\mu$m is formed by CVD to cover the polysilicon layer 31.

Figure 7A:
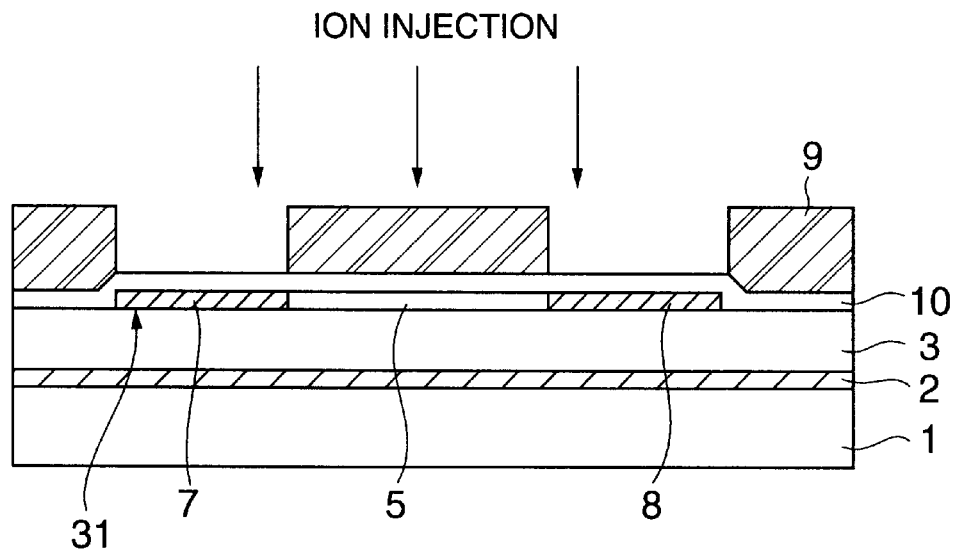
FIG. 7A and FIG. 7B show cross sections of a liquid crystal display device showing ion injection steps of a manufacturing method for manufacturing the device, according to the present invention, respectively.
Figure 7B:
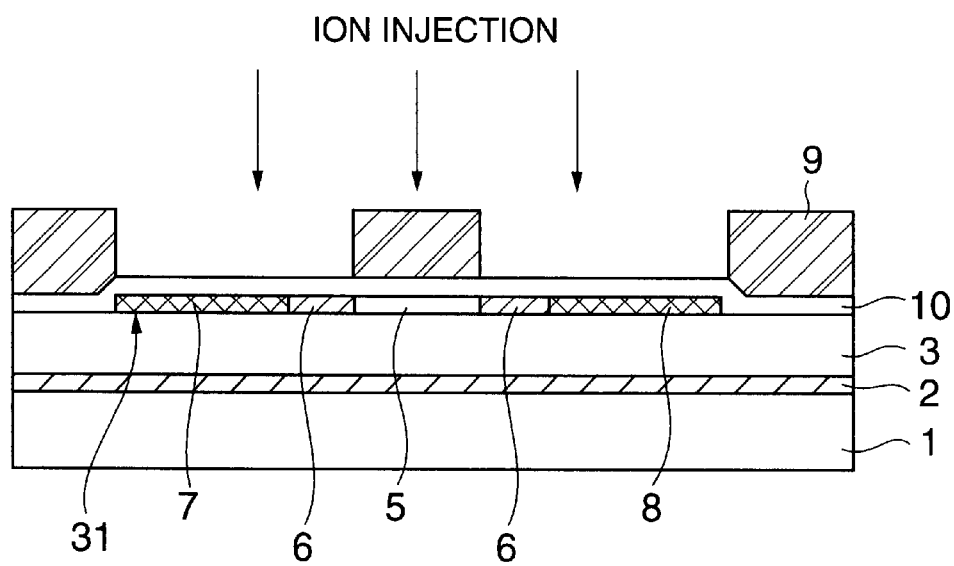

Then, as to be described with reference to FIG. 7A and FIG. 7B, the lightly doped drain (LDD) regions 6, the source region 7 and the drain region 8 are formed by ion-injection. First, as shown in FIG. 7A, the polysilicon layer 31 is patterned by photolithography such that a mask 9 covering the channel region 5 and the LDD regions 6 is formed and, when the TFT to be manufactured is an N type MOS TFT, phosphor ions are injected thereto through the mask. When the TFT is a P type MOS TFT, boron ions are injected. Then, as shown in FIG. 7B, the mask 9 is patterned again to cover only the channel region 5 by photolithography and the same ion injection is performed to form the LDD regions 6, the source region 7 and the drain region 8 and the wafer is annealed to activate the impurities. Then, the second polysilicon layer 32 having thickness of 0.07 $\mu$m is formed on the gate oxide film 10 by CVD and the gate electrode 11 is formed by patterning the second polysilicon layer 32. In the first embodiment, the Gate-Overlap LDD (GOLD) structure is realized by patterning the width of the gate electrode 11 such that it covers the channel region 5 and the LDD regions 6.

After the TFT 30 is fabricated, the metal wiring layer 0.2 $\mu$m thick which becomes the gate line 12 is formed by sputtering of aluminum. The metal wiring layer is patterned to form the gate line and the second interlayer insulating film 13 of SiN having thickness of 0.4 $\mu$m is formed thereon by CVD. Random reflection within the TFT can be reduced by forming a polysilicon layer having reflectivity lower than that of metal or metal silicide in a lower layer as the gate electrode.

On the second interlayer film 13, a second metal wiring layer of aluminum is formed by sputtering and is patterned to form the data line 14. The data line 14 is connected to the source region 7 through the contact hole 18 formed in the second interlayer film 13.

Furthermore, the third interlayer insulating film 15 having thickness of 0.4 $\mu$m of SiN is formed to cover the data line 14 and the second interlayer insulating film 13. On the third interlayer film 15, the second light shielding film 16 having thickness of 0.5 $\mu$m is formed by sputtering of aluminum. The second light shielding film 16 is patterned as a black matrix covering the TFT region 4 and the wiring region.

Moreover, the fourth interlayer insulating film 17 which is 0.8 $\mu$m thick and used for flattening purpose is formed by painting to cover the second light shielding film 16 and the third interlayer insulating film 15. Then, the interlayer insulating film 17 is connected to the drain region 8 through a contact hole 19 formed in the fourth interlayer insulating film 17, the second light shielding film 16, the third interlayer insulating film 15, the second interlayer insulating film 13 and the gate oxide film 10. Finally, the ITO film is formed by sputtering and patterned to a configuration of the respective pixel electrodes 22.

Thereafter, the opposing substrate is prepared and bonded to the TFT substrate and the liquid crystal display device is completed by filling the space between the TFT substrate and the opposing substrate with liquid crystal.

As described above, the manufacturing method of the TFT for the liquid crystal display device, according to the first embodiment of the present invention, comprises the first step of forming the first light shielding film 2 on the transparent substrate 1 and forming the first interlayer insulating film 3 on the first light shielding film 2, the second step of forming the first polysilicon layer 31 on the first interlayer insulating film 3, patterning the first polysilicon layer 31 to the predetermined configuration and forming the gate oxide film 10 on the thus patterned first polysilicon layer 31 and the third step of covering the portions of the first polysilicon layer 31, which become the channel region 5 and the LDD regions 6, and injecting ions to the portions which become the source region and the drain region.

Furthermore, it comprises the fourth step of forming the source region 7, the drain region 8 and the LDD regions 6 by injecting ions to the portions of the first polysilicon layer 31, which become the source region, the drain region and the LDD region, while covering only the channel region 5 and the fifth step of forming the gate line 12 on the gate electrode 11 by forming the second polysilicon layer 32, patterning the latter such that the channel region 5 and the LDD regions 6 are covered thereby to form the gate electrode 11.

Moreover, the method further comprises at least the sixth step of forming the second interlayer insulating film 2 on the gate line 11, forming the data line 15 on the second interlayer insulating film and forming the second light shielding film 16 on the data line 14 through the third interlayer insulating film 15.

Although, in the above description, the gate electrode 11 is provided to cover all of the LDD regions 6, it may be possible to cover the LDD regions partially by the gate electrode. In the latter case, however, the effect of the present invention may be degraded slightly although the object of the present invention can be achieved sufficiently.

Figure 8:
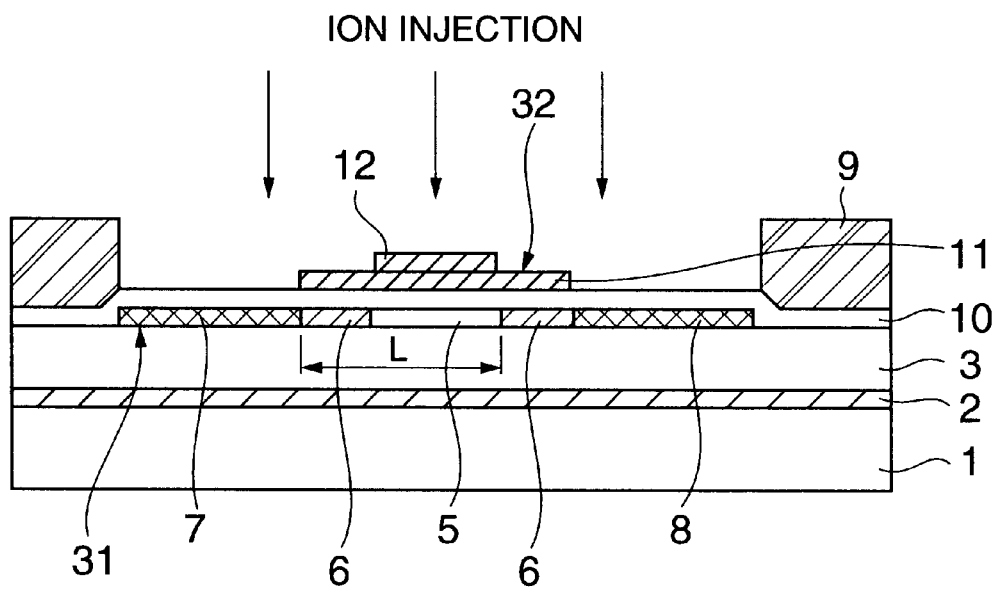
FIG. 8 is a cross section of the second embodiment of the present invention.

Now, the second embodiment of the present invention will be described with reference to FIG. 8.

According to the second embodiment, the previously mentioned GOLD structure is manufactured by ion-injection to the wafer by using the polysilicon layer 32 which becomes the gate electrode 11 as a mask. In the second embodiment, the method up to the step of forming the polysilicon layer 31 which becomes the source region 7 and the drain region 8 is the same as that of the first embodiment. That is, the polysilicon layer 31 is formed and the gate electrode 11 is formed by forming the gate oxide film 10 having thickness of 0.1 μm and the second polysilicon layer 32 having thickness of 0.07 μm and patterning the second polysilicon layer 32. In the second embodiment, the gate electrode 11 is formed such that it covers the channel region 5 and the LDD regions 6. Then, the metal wiring layer of tungsten silicide, which becomes the gate lines 12 and is 0.2 μm thick, is formed by sputtering and is patterned to provide the gate line having a width which is the same as the channel length L. It is possible to injection ion at low density to the wafer below the second polysilicon layer 32 which is not covered by the metal wiring layer to thereby form the source region 7, the drain region 8 and the LDD regions 6 simultaneously.

As described above, the manufacturing method according to the second embodiment up to the second step of forming the gate oxide film 10 is the same as the first embodiment. The second embodiment differs from the first embodiment in that the second embodiment includes the third step of depositing the second polysilicon layer 32 on the gate oxide film 10 and forming the gate electrode 11 by patterning the second polysilicon layer 32 to cover the channel region 5 and the LDD regions 6.

The second embodiment further includes the fourth step of forming the metal wiring layer, which becomes the gate line 12, on the gate electrode 11 and the fifth step of simultaneously forming the source region 7, the drain region 8 and the LDD regions 6 by injecting ions to the wafer with using the gate electrode 11 and the metal wiring layer as a mask, injecting high concentration ions to the LDD regions 6 and low concentration ions to the region which is not covered by the gate electrode 11.

The second embodiment further includes at least the sixth step of forming the second interlayer insulating film 13 on the gate electrode 12, forming the data line 14 on the second interlayer insulating film 13 and forming the second light shielding film 16 on the data line 14 through the third interlayer insulating film 15.

Now, the third embodiment of the present invention will be described with reference to FIG. 9.

Figure 9:
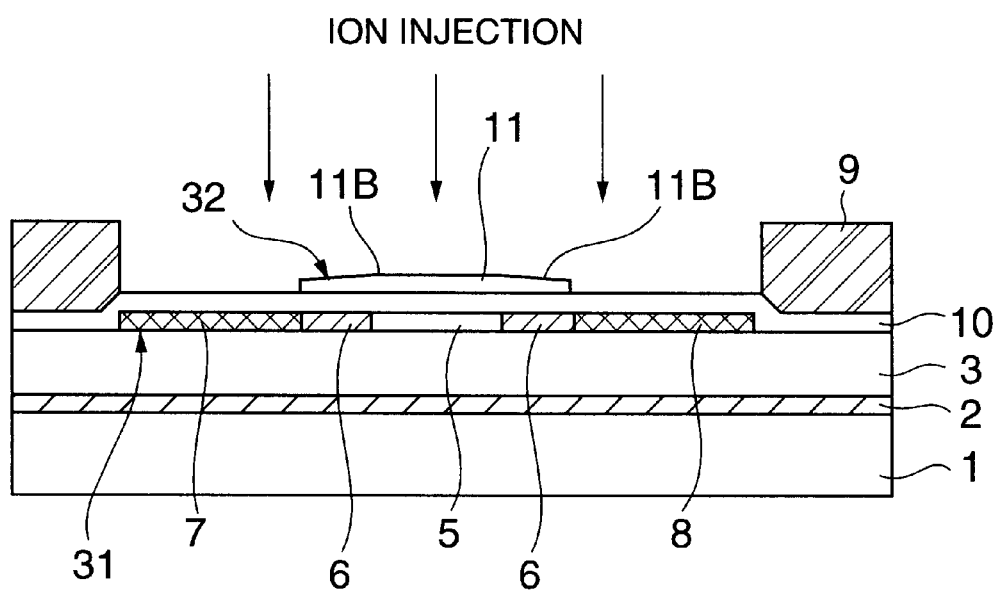
FIG. 9 is a cross section of the third embodiment of the present invention.

According to the third embodiment, the ion injecting step is simplified by tapering opposite end portions 11B of the second polysilicon layer 32, which becomes the gate electrode 11, in the channel length direction, as shown in FIG. 9. That is, in the third embodiment, the gate oxide film 10 is formed after the first polysilicon layer 31 is formed and then patterned. Furthermore, the second polysilicon layer 32, which become the gate electrode 11, is formed and then an oxide film, which becomes a mask, is formed. The second polysilicon layer 32 is patterned by this mask and the opposite end portions 11B of the gate electrode 11 in the channel length direction are tapered by anisotropic etching. Since, by performing ion-injection to the wafer, low concentration impurity is injected to portions of the first polysilicon layer 31 which are below the respective tapered end portions 11B, it is possible to form the LDD regions 6 below the gate electrode 11 and form the source region 7 and the drain region 8 simultaneously with the formation of the LDD regions 6.

As described, the manufacturing method according to the third embodiment up to the second step of forming the gate oxide film 10 is the same as the first or second embodiment. The third embodiment differs from the first or second embodiment in that the third embodiment includes the third step of depositing the second polysilicon layer 32 on the gate oxide film 10, forming the gate electrode 11 by patterning the second polysilicon layer 32 to cover the channel region 5 and the LDD regions 6 and tapering the opposite end portions 11B of the gate electrode 11. In addition, the third embodiment further includes at least the fourth step of simultaneously forming the source region 7, the drain region 8 and the LDD regions 6 by ion-injection using the gate electrode 11 as a mask, the fifth step of forming the metal wiring layer, which becomes the gate line 12, on the gate electrode 11 and the sixth step of forming the second interlayer insulating film 13 on the gate line 12, forming the third interlayer insulating film 15 on the data line 14 and forming the second light shielding film 16 on the data line 14 through the third interlayer insulating film 15.

According to the thin film transistor for use in a liquid crystal display device, of the present invention, the LDD regions thereof, which are very sensitive to light, are covered by the gate electrode constructed with such as a polysilicon film whose reflectivity is low compared with a metal. Therefore, it is possible to reduce an amount of light randomly reflected by the first light shielding film provided below the TFT and the second light shielding film provided above the TFT and arriving at the LDD regions, so that optical leakage current can be reduced and the contrast of the light bulb display screen can be improved.

Although the present invention has been described with reference to specific embodiments, this description is not meant to be construed in a limiting sense. Various modifications of the disclosed embodiments will become apparent to persons skilled in the art upon reference to the description of the invention. It is, therefore, contemplated that the appended claims will cover any modifications or embodiments as fall within the true scope of the present invention.

What is claimed is:

1. A thin film transistor for a liquid crystal display device, comprising:
    a first light shielding film formed on a transparent substrate;
    a semiconductor layer for a transistor, said semiconductor layer being formed on said first light shielding film through a first interlayer insulating film;
    a gate electrode formed on said semiconductor layer through a gate insulating film and having a light shielding function;
    lightly doped drain (LDD) regions formed in areas of said semiconductor layer immediately below said gate electrode in positions on opposite sides of said gate electrode, respectively;
    a gate line formed on said gate electrode such that said gate line is positioned on a channel region defined between said LDD regions;
    a data line formed on said gate electrode and said gate line through a second interlayer insulating film and electrically connected to a source region of said semiconductor layer; and
    a pixel electrode formed on said data line through a third interlayer insulating film and electrically connected to a drain region of said semiconductor layer.

2. A thin film transistor as claimed in claim 1, wherein said gate electrode covers all of said LDD regions.

3. A thin film transistor as claimed in claim 1, wherein said gate electrode covers said LDD regions partially.

4. A thin film transistor as claimed in claim 1, wherein a width of said gate electrode in a direction of said gate line is larger than a width of said channel region in the direction of said gate line.

5. A thin film transistor as claimed in claim 4, wherein the width of said gate electrode in the direction of said gate line is larger than a width of said data line.

6. A thin film transistor as claimed in claim 1, wherein said gate electrode is positioned within a region in which said first light shielding film is formed.

7. A thin film transistor as claimed in claim 6, wherein a center portion of said gate electrode is positioned in a crossing region of said gate line and said data line.

8. A thin film transistor as claimed in claim 1, wherein a thickness of said gate electrode on said LDD regions is smaller than the thickness of said gate electrode on said channel region.

9. A thin film transistor as claimed in claim 8, wherein the thickness of said gate electrode on each said LDD region is gradually reduced with increase of distance from said channel region.

10. A thin film transistor as claimed in claim 1, wherein said gate electrode is formed of an electrically conductive material having reflectivity lower than that of a metal.

11. A thin film transistor as claimed in claim 10, wherein said gate electrode is formed of polysilicon.

12. A thin film transistor as claimed in claim 1, further comprising a second light shielding film formed between said pixel electrode and said third interlayer insulating film and wherein said pixel electrode is formed on said second light shielding film through a fourth interlayer insulating film.

13. A method for manufacturing a thin film transistor for use in a liquid crystal display device, said method comprising the steps of:
    forming a first light shielding film on a transparent substrate;
    forming a semiconductor layer for a transistor on said first light shielding film through a first interlayer insulating film;
    forming a gate electrode on said semiconductor layer through a gate insulating film, said gate electrode having a light shielding function;
    forming LDD regions in areas of said semiconductor layer immediately below said gate electrode in positions on opposite sides of said gate electrode, respectively;
    forming a gate line on said gate electrode such that said gate line is positioned on a channel region defined between said LDD regions;
    forming a second interlayer insulating film on said gate electrode and said gate line;
    forming a data line on said second interlayer insulating film, said data line being electrically connected to a source region of said semiconductor layer;
    forming a third interlayer insulating film on said data line; and
    forming a pixel electrode on said third interlayer insulating film, said pixel electrode being electrically connected to a drain region of said semiconductor layer.

14. A method as claimed in claim 13, further comprising the step of injecting ions, which includes:
    forming a first polysilicon layer as said semiconductor layer;
    patterning said first polysilicon layer to a predetermined configuration;
    forming a gate oxide film on said first polysilicon layer as said gate insulating film;
    masking portions of said first polysilicon layer corresponding to said channel region and said LDD regions; and
    injecting ions to regions of said first polysilicon layer corresponding to said source region and said drain region.

15. A method as claimed in claim 14, further comprising, after the step of injecting ions, the step of forming said source region, said drain region and said LDD regions, which includes:
    masking only said channel region; and
    injecting ions into portions of said first polysilicon layer corresponding to said source region, said drain region and said LDD regions.

16. A method as claimed in claim 15, further comprising the steps of:
    forming a second polysilicon layer as said gate electrode; and patterning said second polysilicon layer to cover said channel region and said LDD regions to thereby form said gate electrode.

17. A method as claimed in claim 13, further comprising, before the step of forming said pixel electrode, the steps of:
   forming a second light shielding film on said third interlayer insulating film;
   forming a fourth interlayer insulating film on said second light shielding film; and
   forming said pixel electrode on said fourth interlayer insulating film.

18. A method as claimed in claim 13, further comprising the steps of:
   forming said gate electrode by forming a first polysilicon layer as said semiconductor layer, patterning said first polysilicon layer to a predetermined configuration, forming a gate oxide film on said first polysilicon layer as said gate insulating film, depositing a second polysilicon layer on said gate oxide film and patterning said second polysilicon layer to cover said channel region and said LDD regions;
   forming a metal wiring layer on said gate electrode to form a gate line; and
   simultaneously forming said source region, said drain region and said LDD regions by injecting ions to said second polysilicon layer with using said gate electrode and said metal wiring layer as a mask such that said LDD regions, which are covered by said gate electrode, are injected with low concentration ions and the remaining region, which is not covered by said gate electrode, is injected with high concentration ions.

19. A method as claimed in claim 13, further comprising the steps of:
   forming said gate electrode by forming a first polysilicon layer as said semiconductor layer, patterning said first polysilicon layer to a predetermined configuration, forming a gate oxide film on said first polysilicon layer as said gate insulating film, depositing a second polysilicon layer on said gate oxide film, patterning said second polysilicon layer to cover said channel region and said LDD regions and tapering opposite end portions of said gate electrode such that thickness of said opposite end portions of said gate electrode is reduced gradually; and
   simultaneously forming said source region, said drain region and said LDD regions by injecting ions to said second polysilicon layer with using said gate electrode as a mask.

* * * * *